United States Patent
Ker et al.

(10) Patent No.: US 10,041,995 B2
(45) Date of Patent: Aug. 7, 2018

(54) TEST METHOD FOR ELIMINATING ELECTROSTATIC CHARGES

(71) Applicant: AMAZING MICROELECTRONIC CORP., New Taipei (TW)

(72) Inventors: Ming-Dou Ker, Hsinchu County (TW); Che-Hao Chuang, Hsinchu County (TW)

(73) Assignee: Amazing Microelectronic Corp., New Taipei (TW)

( * ) Notice: Subject to any disclaimer, the term of this patent is extended or adjusted under 35 U.S.C. 154(b) by 226 days.

(21) Appl. No.: 14/597,413

(22) Filed: Jan. 15, 2015

(65) Prior Publication Data
US 2016/0209463 A1 Jul. 21, 2016

(51) Int. Cl.
*G01R 31/20* (2006.01)
*H01L 23/495* (2006.01)
*G01R 31/28* (2006.01)

(52) U.S. Cl.
CPC ............................... *G01R 31/2893* (2013.01)

(58) Field of Classification Search
CPC .................................................. G01R 31/2893
USPC ..... 324/452, 454, 457, 750.22, 109, 750.25, 324/750.01, 757.04; 257/676
See application file for complete search history.

(56) References Cited

U.S. PATENT DOCUMENTS

| | | | | |
|---|---|---|---|---|
| 5,386,141 A | * | 1/1995 | Liang | H01L 23/49503 257/676 |
| 2003/0117162 A1 | * | 6/2003 | Watts | G01R 31/2851 324/757.04 |
| 2003/0141860 A1 | * | 7/2003 | Chi | G01R 31/2868 324/750.03 |
| 2004/0082083 A1 | * | 4/2004 | Kraz | G01R 31/18 438/14 |
| 2009/0066354 A1 | * | 3/2009 | Gaertner | G01R 31/002 324/754.08 |
| 2013/0285689 A1 | | 10/2013 | Huang | |

FOREIGN PATENT DOCUMENTS

| | | |
|---|---|---|
| TW | 591734 | 4/1992 |
| TW | M406256 U1 | 6/2011 |
| WO | WO 2010143932 A1 * 12/2010 | ......... G01R 1/06711 |

OTHER PUBLICATIONS

Ming-Dou Ker, Jeng-Jie Peng and Hsin-Chin Jiang, "ESD test methods on integrated circuits: an overview," Electronics, Circuits and Systems, 2001. ICECS 2001. The 8th IEEE International Conference on, 2001, pp. 1011-1014 vol. 2.*

* cited by examiner

*Primary Examiner* — Farhana Hoque
(74) *Attorney, Agent, or Firm* — Rosenberg, Klein & Lee

(57) ABSTRACT

In a test method for eliminating electrostatic charges, at least one test process is firstly performed by a test equipment comprising a tester and a platform, and electrostatic charges are generated on the test equipment in the test process. In the test process, the tester contacts and tests at least one tested integrated circuit (IC) on a test area of the platform, and then the tested IC is removed from the tester and the test area. Next, a conduction device which is grounded is moved to the test area, so that the tester contacts the conduction device to discharge the electrostatic charges to ground. Next, the conduction device is removed from the tester and the test area. Finally, the method returns to the test process to test the next tested IC.

7 Claims, 4 Drawing Sheets

TEST METHOD FOR ELIMINATING ELECTROSTATIC CHARGES

BACKGROUND OF THE INVENTION

Field of the Invention

The present invention relates to a test method, particularly to a test method for eliminating electrostatic charges.

Description of the Related Art

Electrostatics is a branch of physics that deals with the phenomena and properties of stationary or slow-moving electric charges with no acceleration. Since classical physics, it has been known that some materials such as amber attract lightweight particles after rubbing. Electrostatic phenomena arise from the forces that electric charges exert on each other. Such forces are described by Coulomb's law.

There are many examples of electrostatic phenomena, from those as simple as the attraction of the plastic wrap to your hand after you remove it from a package, to the apparently spontaneous explosion of grain silos, to damage of electronic components during manufacturing, to the operation of photocopiers. Electrostatics involves the buildup of charge on the surface of objects due to contact with other surfaces. Although charge exchange happens whenever any two surfaces contact and separate, the effects of charge exchange are usually only noticed when at least one of the surfaces has a high resistance to electrical flow. This is because the charges that transfer to or from the highly resistive surface are more or less trapped there for a long enough time for their effects to be observed. In general, there are many testers in a laboratory. After a human body touches the tester or the tester tests ICs for a long time, electrostatic charges are generated on the surface of the tester. When the probes of the tester electrically contact an IC next time, the electrostatic charges move from the tester to the IC. As long as the IC operates, the electrostatic charges cause damage to the IC.

To overcome the abovementioned problems, the present invention provides a test method for eliminating electrostatic charges, so as to solve the afore-mentioned problems of the prior art.

SUMMARY OF THE INVENTION

A primary objective of the present invention is to provide a test method for eliminating electrostatic charges, which inserts a conduction device which is grounded in the process for testing at least two tested IC, so as to discharge electrostatic charges on the surface of a tester without modifying the tester. Thus, the test cost is reduced.

To achieve the abovementioned objectives, the present invention provides a test method for eliminating electrostatic charges by using a test equipment. The test equipment comprises a tester and a platform. Firstly, at least one test process is performed, and electrostatic charges are generated on the test equipment in the test process. In the test process, the tester contacts and tests at least one tested integrated circuit (IC) on a test area of the platform, and then the tested IC is removed from the tester and the test area. Next, a conduction device which is grounded is moved to the test area, so that the tester contacts the conduction device to discharge the electrostatic charges to ground. Next, the conduction device is removed from the tester and the test area. Finally, the method returns to the test process to test the next tested IC.

Below, the embodiments are described in detail in cooperation with the drawings to make easily understood the technical contents, characteristics and accomplishments of the present invention.

DETAILED DESCRIPTION OF THE INVENTION

Figure 1:
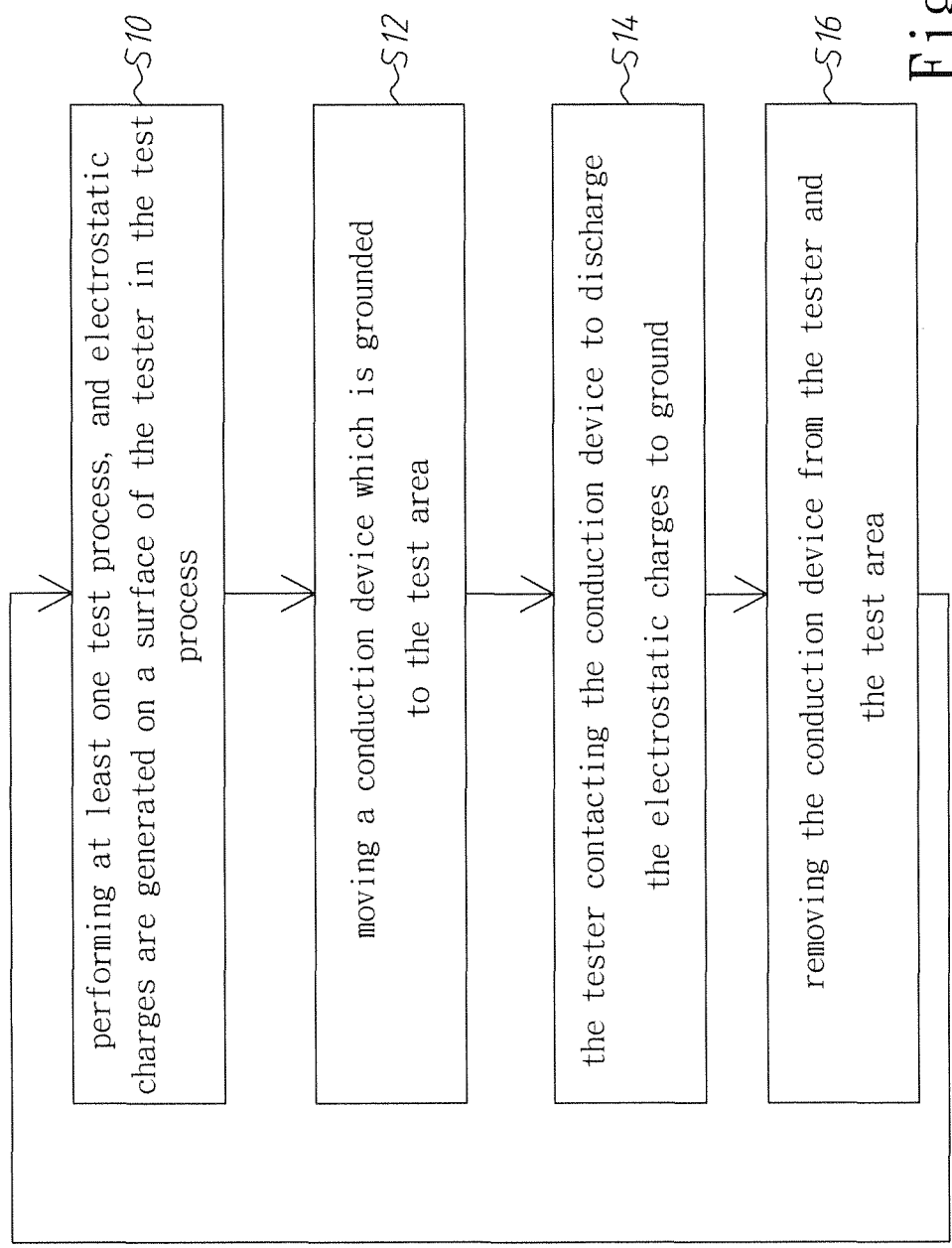
FIG. 1 is a flow chart showing a test method for eliminating electrostatic charges according to an embodiment of the present invention.
Figure 3:
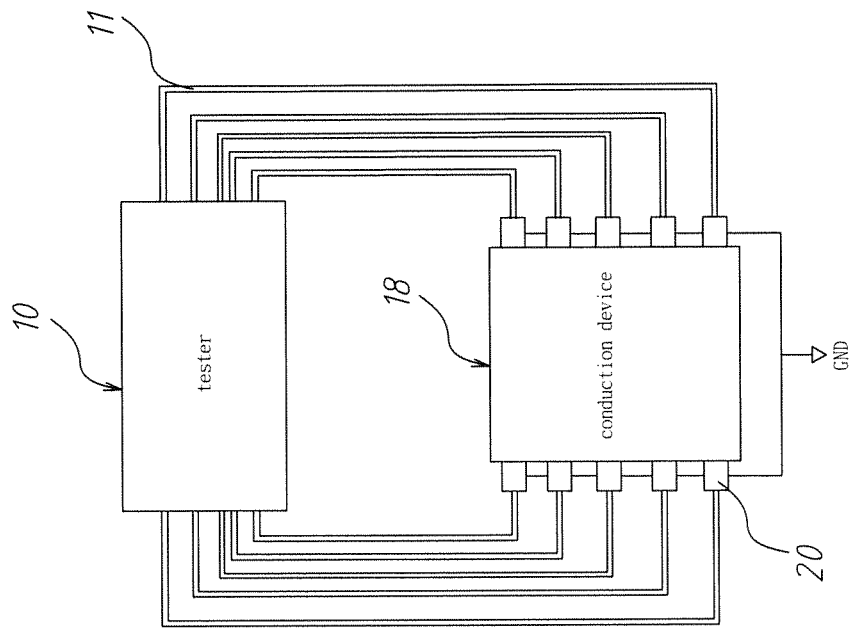
FIG. 3 is a diagram schematically showing the tester and a conduction device of the present invention.
Figure 2:
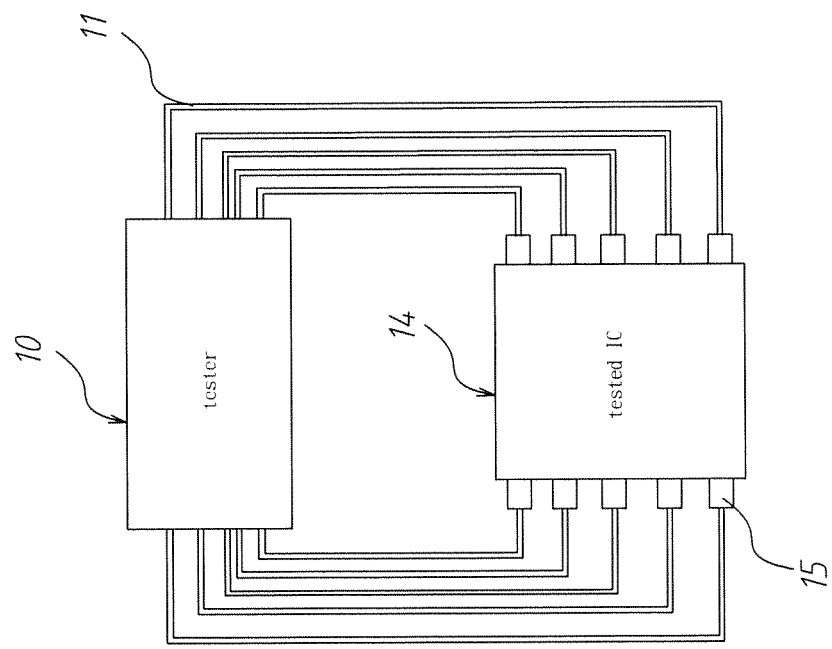
FIG. 2 is a diagram schematically showing a tester and a tested IC of the present invention.
Figure 4:
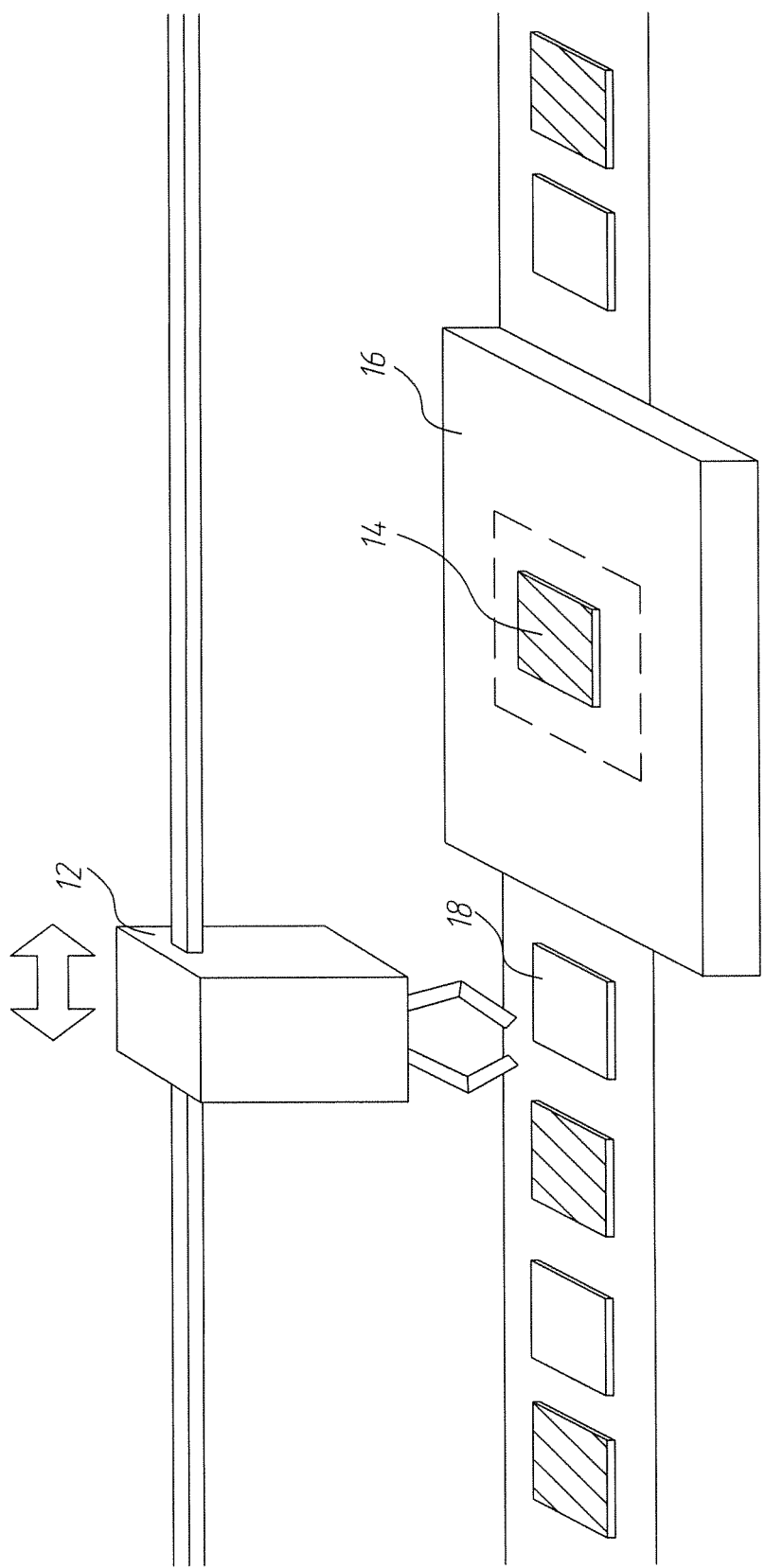
FIG. 4 is a diagram schematically showing a robot arm moving the tested IC and the conduction device of the present invention.

Refer to FIG. 1, FIG. 2, FIG. 3 and FIG. 4. The test method of the present invention uses a test equipment comprising a tester 10, at least one robot arm 12 and a platform 16, wherein the tester 10 has a plurality of probes 11. Firstly, in Step S10, at least one test process is performed. For example, the test process can be performed one time. In the test process, at least one robot arm 12 automatically holds at least one tested integrated circuit (IC) 14 and places it on a test area of the platform 16, whereby the probes 11 of the tester 10 respectively automatically contact a plurality of pins 15 of the tested IC 14 to test the tested IC 14, and then the tested IC 14 is automatically removed from the probes 11 of the tester 10 and the test area by the robot arm 12, wherein the test area is shown by a dashed frame. In the embodiment, the amounts of the tested IC 14 and the robot arm 12 used in each test process are respectively one and one, which is used as an example. Electrostatic charges are generated on the test equipment in the test process. For example, since the probes 11 respectively contact the pins 15 of the tested IC 14, electrostatic charges on a surface of the tester 10 may be generated by the tested IC 14 contacting and separating the tester 10 in the test process. Alternatively or in combination, the electrostatic charges on the surface of the tester 10 may be generated by a human body contacting and separating the tester 10 in the test process.

After the test process, in Step S12, the robot arm 12 automatically holds a conduction device 18 and places it on the test area, wherein the conduction device 18 comprises a plurality of pins 20 which is grounded, and the pins 20 and the pins 15 of the tested IC 14 have identical amount and arrangement. Then, in Step S14, the probes 11 of the tester 10 respectively automatically contact the pins 20 of the conduction device 18, so as to discharge the electrostatic charges to ground without modifying the tester 10. Thus, the test cost can be reduced. Then, in Step S16, the conduction device 18 is removed from the probes 11 of the tester 10 and the test area by the robot arm 12. Then, the test method returns to Step S10 to test the next tested IC 14.

Figure 7:
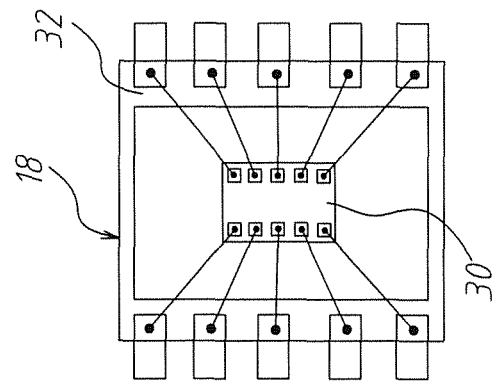
FIG. 7 is a diagram schematically showing the conduction device according to the third embodiment of the present invention.
Figure 6:
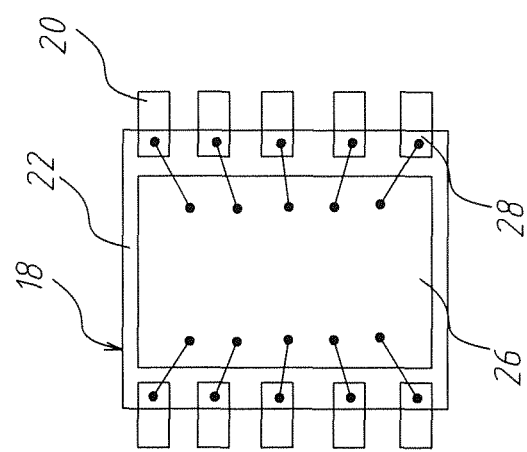
FIG. 6 is a diagram schematically showing the conduction device according to the second embodiment of the present invention.
Figure 5:
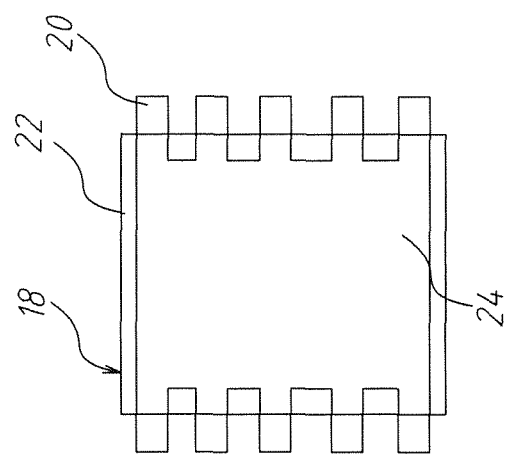
FIG. 5 is a diagram schematically showing the conduction device according to the first embodiment of the present invention.

Below is the introduction of the conduction device 18. Refer to FIG. 5, FIG. 6 and FIG. 7. As shown in FIG. 5, the conduction device 18 further comprises a base 22 and a conduction paddle 24. The perimeter of the base 22 is connected with the pins 20 of the conduction device 18. The conduction paddle 24 is arranged on the base 22 and connected with the pins 20 of the conduction device 18. Besides, the conduction paddle 24 further comprises a first conduction block 26 and a plurality of second conduction blocks 28 connected with the first conduction block 26 by wire bonding, and the second conduction blocks 28 are respectively connected with the pins 20 of the conduction device 18, as shown in FIG. 6. Furthermore, the conduction device 18 is also realized with an elimination integrated circuit (IC) with a plurality of pins thereof respectively used as the pins 20 of the conduction device 18, as shown in FIG. 7. The elimination IC comprises a die 30 and a lead frame 32. Since the structure of the elimination IC is identical to that of the tested IC 14, the cost of fabricating the conduction device 18 different from the tested IC 14 can be saved.

In the test process, the tester 10 can simultaneously test a plurality of tested ICs 14 while there is a plurality of robot arms 12. Specifically, the robot arm 12 respectively automatically hold the tested ICs 14 and places them on the test area, whereby the probes 11 of the tester 10 respectively automatically contact a plurality of pins 15 of each tested IC 14 to test the tested ICs 14, and then the robot arms 12 respectively automatically remove the tested ICs 14 from the probes 11 of the tester 10 and the test area.

In conclusion, the present invention uses the conduction device in the test process, so as to discharge the electrostatic charges on the tester. As a result, the problem with modifying the tester can be solved to reduce the test cost.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A test method for eliminating electrostatic charges, which uses a test equipment comprising at least one robot arm, a tester and a platform; said test method comprising steps of:
   performing at least one test process, and electrostatic charges are generated on a surface of said tester of said test equipment in said test process, and said test process further comprises steps of:
      said tester contacting and testing at least one tested integrated circuit (IC) on a test area of said platform; and
      said robot arm removing said tested IC from said tester and said test area;
      said robot arm holding a moveable conduction device which is grounded and placing said moveable conduction device on said test area, wherein said moveable conduction device further comprises a die, a lead frame, a conduction paddle and a plurality of pins, and said pins are grounded, and a perimeter of said lead frame is connected with said pins, and said conduction paddle is arranged on said lead frame and connected with said pins, and said conduction paddle further comprises a first conduction block and a plurality of second conduction blocks connected with said first conduction block by wire bonding, and said second conduction blocks are respectively connected with said pins, and said die is arranged on said first conduction block;
      said tester contacting said pins of said moveable conduction device which are grounded to discharge said electrostatic charges on said surface of said tester to ground;
      said robot arm removing said moveable conduction device from said tester and said test area; and
      returning to said test process to test next said tested IC.

2. The test method for eliminating electrostatic charges according to claim 1, wherein said electrostatic charges are generated by a human body or said tested IC contacting and separating said tester.

3. The test method for eliminating electrostatic charges according to claim 1, wherein said tester has a plurality of probes, and in said step of said tester contacting said tested IC, said probes of said tester respectively contacting a plurality of pins of said tested IC.

4. The test method for eliminating electrostatic charges according to claim 3, wherein in said step of said tester contacting said pins of said conduction device, said probes of said tester respectively contact said pins of said conduction device.

5. The test method for eliminating electrostatic charges according to claim 4, wherein said pins of said conduction device and said pins of said tested IC have identical amount and arrangement.

6. The test method for eliminating electrostatic charges according to claim 1, wherein in said step of said tester contacting and testing said tested IC, said robot arm holds said tested IC and places it on said test area, whereby said tester contacts and tests said tested IC; and in said step of removing said tested IC from said tester and said test area, said tested IC is removed from said tester and said test area by said robot arm.

7. The test method for eliminating electrostatic charges according to claim 6, wherein said at least one tested IC is a plurality of tested IC, and said at least one robot arm is a plurality of robot arms.

* * * * *